US008025201B2

(12) United States Patent
Miller et al.

(10) Patent No.: US 8,025,201 B2
(45) Date of Patent: Sep. 27, 2011

(54) METHODS AND APPARATUS FOR INTEGRATED CIRCUIT BALL BONDING WITH SUBSTANTIALLY PERPENDICULAR WIRE BOND PROFILES

(75) Inventors: Curtis James Miller, West Lawn, PA (US); Nelson Troncoso, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 876 days.

(21) Appl. No.: 11/395,779

(22) Filed: Mar. 31, 2006

(65) Prior Publication Data

US 2006/0172524 A1    Aug. 3, 2006

Related U.S. Application Data

(62) Division of application No. 10/786,182, filed on Feb. 25, 2004, now Pat. No. 7,074,705.

(51) Int. Cl.
*B23K 37/00* (2006.01)
*B23K 31/02* (2006.01)

(52) U.S. Cl. ..................... 228/4.5; 228/180.5

(58) Field of Classification Search .......... 228/180.5, 228/4.1, 4.5
See application file for complete search history.

(56) References Cited

U.S. PATENT DOCUMENTS

| | | | |
|---|---|---|---|
| 4,393,392 A * | 7/1983 | Hale | 257/664 |
| 5,054,194 A * | 10/1991 | Pollock | 29/840 |
| 5,205,463 A | 4/1993 | Holdgrafer et al. | 228/102 |
| 6,072,211 A | 6/2000 | Miller et al. | 257/308 |
| 6,181,200 B1 * | 1/2001 | Titizian et al. | 330/66 |
| 6,452,255 B1 * | 9/2002 | Bayan et al. | 257/666 |
| 6,538,336 B1 | 3/2003 | Secker et al. | 257/786 |
| 6,646,521 B1 * | 11/2003 | Huang | 333/33 |
| 7,002,249 B2 * | 2/2006 | Duffy et al. | 257/728 |
| 7,227,095 B2 * | 6/2007 | Roberts et al. | 219/69.11 |
| 7,229,906 B2 * | 6/2007 | Babinetz et al. | 438/617 |
| 7,302,756 B2 * | 12/2007 | Taggart et al. | 29/850 |
| 2002/0013048 A1 * | 1/2002 | Macheel et al. | 438/650 |
| 2002/0050653 A1 * | 5/2002 | Masumoto et al. | 257/784 |
| 2003/0006266 A1 * | 1/2003 | Wong et al. | 228/4.5 |
| 2003/0205725 A1 | 11/2003 | Masumoto et al. | 257/200 |
| 2004/0124545 A1 | 7/2004 | Wang | 257/784 |
| 2005/0072833 A1 * | 4/2005 | Wong et al. | 228/180.5 |

OTHER PUBLICATIONS

V. Solberg, "Adapting Fine-Line Flex Circuits for 3D Multiple Die Packaging," Semiconductor Manufacturing, pp. 94-108, Jun. 2003.

* cited by examiner

*Primary Examiner* — Jessica L Ward
*Assistant Examiner* — Jacky Yuen
(74) *Attorney, Agent, or Firm* — Ryan, Mason & Lewis, LLP

(57) ABSTRACT

Techniques for ball bonding wires in an integrated circuit are provided which allow formation of desired wire bond profile shapes for optimal performance. A wire is ball bonded to a first bond site in the integrated circuit with a bonding tool and at least one bend is formed in the wire. The wire is terminated at a second bond site with the bonding tool, thereby creating a wire bond profile. The technique is repeated for a plurality of additional wire bonds of the integrated circuit, and at least two wire bond profiles in the integrated circuit are substantially perpendicular to one another at a crossing point of the profiles.

21 Claims, 4 Drawing Sheets

METHODS AND APPARATUS FOR INTEGRATED CIRCUIT BALL BONDING WITH SUBSTANTIALLY PERPENDICULAR WIRE BOND PROFILES

CROSS REFERENCE TO RELATED APPLICATION

This application is a divisional of U.S. application Ser. No. 10/786,182, filed Feb. 25, 2004 now U.S. Pat. No. 7,074,705, the disclosure of which is incorporated by reference herein.

FIELD OF THE INVENTION

The present invention relates generally to the field of integrated circuits and, more particularly, to wire-bonding operations performed on an integrated circuit during packaging.

BACKGROUND OF THE INVENTION

A radio frequency (RF) integrated circuit may include multiple transistor dies that are placed in an integrated circuit package by a die attach machine. A robotic bonding tool may then be used to wire bond the dies to other circuit elements within the package, and to leads of a package leadframe. Such a tool generally includes a surface/wire-feed detection system that detects bond pads or other bond sites of a given die, and determines the height coordinates of these bond pads. The other circuit elements in an RF integrated circuit may include, for example, tuning capacitors.

The wire bonding of the various circuit elements may create several differently-shaped wire bond profiles, depending on the placement of the various circuit elements to be connected by wire bonds. A wire bond profile may be characterized as a side or profile view of a wire extending from a first bond site to a second bond site. In an RF integrated circuit, the wire bonds may carry high frequency signals. Certain types of RF integrated circuits, such as RF power transistors, are tuned through these wire bond profiles. Therefore, it is important for these wire bond profiles to achieve a desired shape for optimal RF performance.

The two major wire-bonding processes used for electronic package interconnects are wedge bonding and ball bonding. The wedge-bonding process has traditionally been used to form the package interconnects of RF integrated circuits due to its ease in forming the wire bond profiles necessary for optimal RF performance. While ball bonding provides a more economical and robust process than that of wedge bonding, the inability of traditional ball bonders to achieve the necessary wire bond profiles has created an overwhelming bias against using modern ball-bonding processes for wire bonding RF integrated circuits.

Traditional ball bonders typically incorporate a single reverse motion of the bonding tool during wire bond profile formation so that the completed wire bond profile may have a section of wire that extends vertically for a considerable distance above the ball at the first bond site. However, traditional ball bonders have difficulty in precisely controlling the amount of wire in the wire bond profile. For example, traditional ball bonders do not have a sufficient range of z-axis motion to enable all the requisite wire to be fed out above the first bond site for high wire bond profiles. Consequently, the wire continues to be fed out during the approach to the second bond site. As the bonding tool moves away from the first bond site, the drag of the wire through the tool increases, which introduces variability in the amount of wire length in the wire bond profile. This is unacceptable for RF applications.

Thus, wire bond profiles with vertical extensions above the first bond site are skewed or bowed away from the second bond site, thereby deviating from the desired wire bond profile shape. This bow away from the second bond site causes increased cross coupling with other wire bonds in the RF integrated circuit. The inability of the traditional ball bonder to produce desired wire bond profiles also prevents crossing points of wire bond profiles from occurring at a point where the wires are substantially perpendicular. These deviated crossing points also cause increased cross coupling in the RF integrated circuit.

Traditional ball bonders are generally only able to perform ball-bonding operations from a die to packaging or leadframe leads, since the wire bond terminations are too harsh for a die surface. These terminations are traditionally similar to wedge bonds. Additionally, the ball size associated with the traditional ball bonder is very large, typically four times the wire diameter, requiring the use of larger bond pads. Since optimal RF performance often requires minimal bond pad size, the larger ball sizes are also a factor in favoring the use of wedge bonding instead of ball bonding in the fabrication of RF integrated circuits.

A ball-bumping technique of modern ball bonders may allow wire bond terminations to be placed on a primary die and capacitors without being too harsh for the die surface. Ball bumping was developed for ball bonding to allow chip-to-chip jumper wires to be bonded. Additional recent developments in commercially-available ball bonders include improvements such as the ability to perform two separate reverse motions, ball size reduction, and wire length control. Nonetheless, a need remains for further improvements in ball-bonding techniques, particularly in RF integrated circuit applications.

SUMMARY OF THE INVENTION

The present invention in an illustrative embodiment provides techniques for ball bonding wires in an RF integrated circuit, in a manner that permits the formation of desired wire bond profile shapes for optimal RF performance.

In accordance with one aspect of the invention, techniques for performing a wire-bonding operation in an integrated circuit are provided. A wire is ball bonded to a first bond site in the integrated circuit with a bonding tool and at least one bend is formed in the wire. The wire is terminated at a second bond site with the bonding tool, thereby creating a wire bond profile. The technique is repeated for a plurality of additional wire bonds of the integrated circuit, and at least two wire bond profiles in the integrated circuit are substantially perpendicular to one another at a crossing point of the profiles.

In accordance with another aspect of the invention a negative reverse motion and a positive reverse motion are applied during the wire-bonding operation to form bends in the wire. The negative reverse motion may be a movement of the bonding tool vertically above the ball bond and in a first horizontal direction toward the second bond site. The positive reverse motion may be a movement of the bonding tool vertically above the ball bond and in a second horizontal direction that is opposite the first direction, or away from the second bond site.

Advantageously, an illustrative embodiment of the present invention produces wire bond profiles shaped for optimal RF performance utilizing a ball-bonding technique. In being shaped for optimal RF performance the wire bond profiles do not skew or bow away from the second bond site. Additionally, the wire bond profiles may be substantially perpendicular at their crossing point, thereby minimizing cross coupling.

Therefore, the illustrative embodiment of the present invention achieves the necessary RF performance at a lower cost by using a ball-bonding technique instead of wedge bonding.

These and other objects, features, and advantages of the present invention will become apparent from the following detailed description of the illustrative embodiments thereof, which is to be read in connection with the accompanying drawings.

DETAILED DESCRIPTION

As will be described in detail below, the present invention in the illustrative embodiment achieves wire bond profile shapes for optimal RF performance with ball bonds as the wire interconnects.

Figure 1:
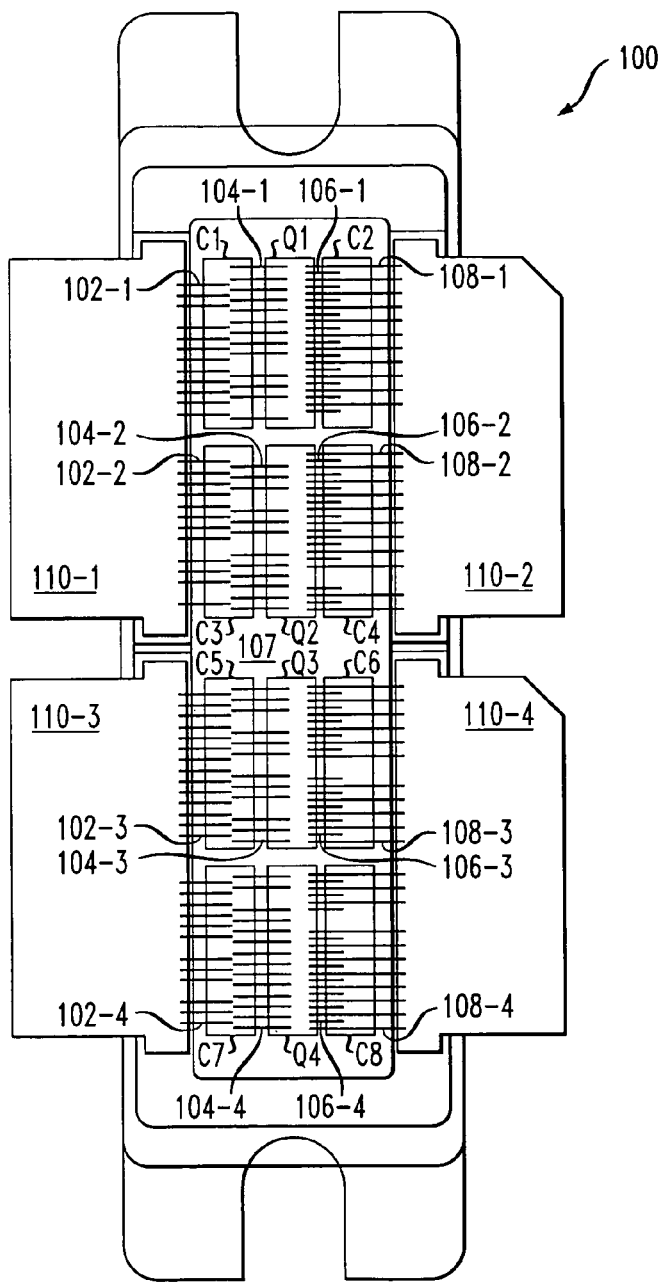
FIG. 1 is a diagram illustrating a top cut-away view of a packaged integrated circuit having wire bonds between dies, capacitors and leads, according to an embodiment of the present invention.

Referring initially to FIG. 1, dies Q1, Q2, Q3, Q4, are disposed in a packaged RF integrated circuit 100 on a substrate 107. Integrated circuit 100 is shown with an upper portion of the package removed so that the internal elements and wires are visible. FIG. 1 shows die Q1 disposed between capacitors C1, C2; die Q2 between capacitors C3, C4; die Q3 between capacitors C5, C6; and die Q4 between capacitors C7, C8. In this embodiment, dies Q1-Q4 are transistor dies and capacitors C1-C8 are tuning capacitors of packaged RF integrated circuit 100. Dies Q1-Q4 and tuning capacitors C1-C8 are disposed within an integrated circuit package. The package comprises a leadframe having leads illustrated by elements 110-1, 110-2, 110-3, 110-4.

As shown in the figure, a first set of wires 102-1 connects lead 110-1 to first tuning capacitor C1. Similarly, a second set of wires 104-1 connects first tuning capacitor C1 to die Q1, a third set of wires 106-1 connects die Q1 to second tuning capacitor C2, and a fourth set of wires 108-1 connects die Q1 to lead 110-2. These wire sets are repeated for each capacitor-die-capacitor arrangement. Wire sets 102-2, 104-2, 106-2, 108-2 provide connections for die Q2 and its associated capacitors C3 and C4. Wire sets 102-3, 104-3, 106-3, 108-3 provide connections for die Q3 and its associated capacitors C5 and C6. Wire sets 102-4, 104-4, 106-4, 108-4 provide connections for die Q4 and its associated capacitors C7 and C8.

Figure 2:
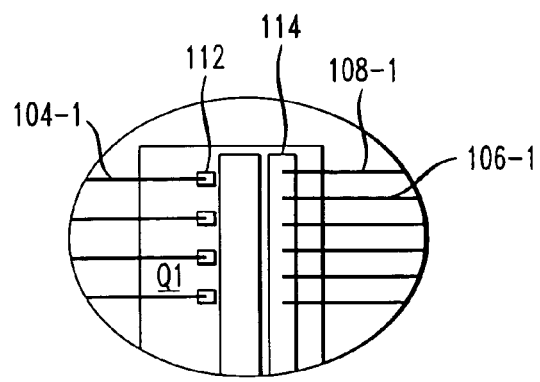
FIG. 2 is a diagram illustrating a magnified view of a die of the integrated circuit of FIG. 1, according to an embodiment of the present invention.

Referring now to FIG. 2, a more detailed view of a portion of die Q1 is shown, illustrating the set of wires 104-1 extending out from the left side of die Q1, and sets of wires 106-1 and 108-1 extending out from the right side of die Q1. In this embodiment, sets of wires 104-1 and 106-1 connect to tuning capacitors, while set of wires 108-1 connects to the integrated circuit package lead 110-2. Wires of the set 104-1 are individually bonded to die Q1 at individual bond pads 112. Sets of wires 106-1 and 108-1 are bonded to die Q1 at a bond strip 114. Bond pads, bond strips or other types of bond sites can be utilized for each of the bonding areas on the dies, capacitors or leads.

Figure 3:
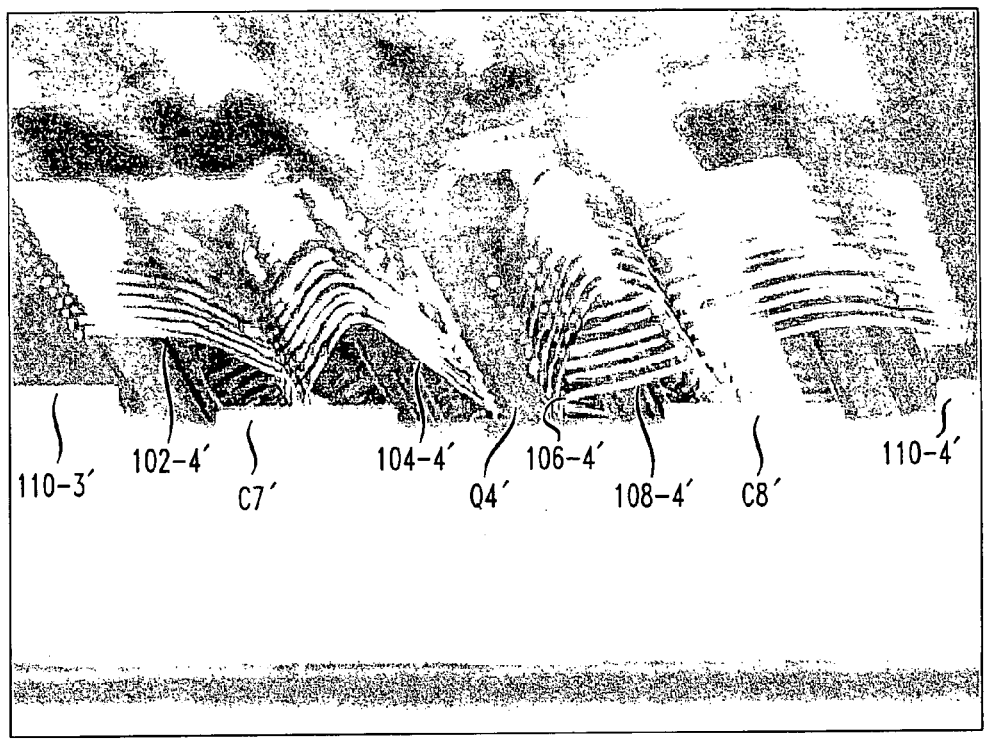
FIG. 3 is a photograph showing a perspective view of a packaged integrated circuit of the type shown in FIG. 1, having wire bonds between a die, capacitors, and leads, according to an embodiment of the present invention.

Referring now to FIG. 3, a photograph shows a perspective view of a packaged integrated circuit of the type shown in FIG. 1, having wire bonds between a die, capacitors, and leads, according to an embodiment of the present invention. Packaged RF integrated circuit 100' has a die Q4' disposed between two capacitors C7', C8'. Leads 110-3', 110-4' are adjacent respective capacitors C7', C8'. A first wire bond set 102-4' extends from bond sites on lead 110-3' to bond sites on first capacitor C7'. A second wire bond set 104-4' connects bond sites on first capacitor C7' to bond sites on die Q4'. A third wire bond set 106-4' connects bond sites on die Q4' to bond sites on second capacitor C8'. Finally, a fourth wire bond set 108-4' connects bond sites on die Q4' to bond sites on lead 110-4'. Multiple connections or wire bonds are shown connecting these elements using a ball-bonding technique of the present invention. It is generally advantageous that wires connecting similar elements have substantially identical wire bond profiles, although this is not a requirement of the invention.

Figure 4:
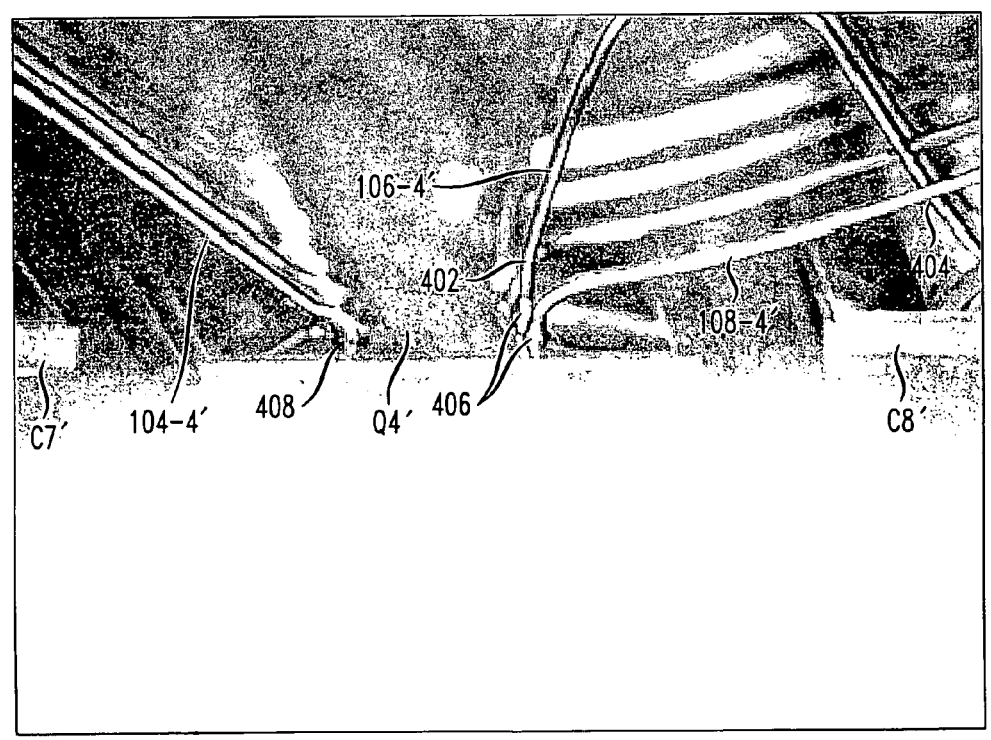
FIG. 4 is a photograph showing a magnified side view of the packaged integrated circuit of FIG. 3, having ball-bonded and ball-bumped connections to the die, according to an embodiment of the present invention.

Referring now to FIG. 4, a photograph shows a magnified view of a portion of die Q4' of packaged integrated circuit 100' of FIG. 3. Third wire bond set 106-4' has properly-shaped high wire bond profiles over a short distance, having a height of, for example, approximately 0.6 mm (0.025 in.). The wire bond profiles of third wire bond set 106-4' are not skewed or bowed away from the second bond site, thereby reducing the cross coupling with wire bonds of wire bond set 104-4' of the integrated circuit. The non-skewed or non-bowed shape is achieved by forming two bends in the wire during the ball-bonding operation. These bends are created through two separate reverse motions as the wire is drawn out above the initial ball bond site, which will be discussed in conjunction with FIG. 6 below. The two bends are in opposite directions. However, both bends are not always visible when the ball-bonding operation is complete, since they may be incorporated into the wire bond profile shape.

In high wire bond profiles, such as those in wire bond set 106-4', the first bend is placed a short distance above the first ball bond. For example, bend 402 may be placed approximately 0.2 mm (0.008 in.) along the length of the wire from a ball bond site 406 on die Q4', as the wire is being drawn out above ball bond site 406. A second bend may be placed further along the length of the wires of wire bond set 106-4' as the wire is drawn out further above ball bond site 406, for example, at approximately 0.6 mm (0.025 in.). When the wire is terminated at the second bond site, these bends help to create a wire bond profile having a substantially vertical section of wire directly above the first bond site, and a gently bending form that terminates at the second bond site.

Further, bends created using reverse motions in wire bond profile formation also provide wire bond profiles that are properly shaped in relation to other wire bond profiles. For example, it is often desirable for the wires of third wire bond set 106-4' and fourth wire bond set 108-4' to be substantially perpendicular at a crossing point of the profiles of the two sets. These approximately 90-degree angles formed at the crossing point minimize cross coupling and help to achieve optimal RF performance of the integrated circuit. Substantially perpendicular crossing point 404 is shown in FIG. 4.

Wires of fourth wire bond set 108-4' had a bend placed at approximately 1.1 mm (0.04 in.) along the length of the wire, while the wire was drawn out above ball bond 406 during wire bond formation. A second bend in the opposite direction was also placed in the wire before terminating the wire at the second bond site and completing the corresponding wire bond profile. Since the first bend is placed much further along the wire length than it is in the creation of other wire bonds, wire bond set 108-4' does not have a substantially vertical section above ball bond 406 and has a lower relative wire bond profile height, which helps to lower the crossing point. This lower crossing point is more likely to occur when two intersecting wire bond profiles of wire bond set 106-4' and 108-4' are substantially perpendicular.

It should be noted that substantial perpendicularity between wire profiles could be provided for other wire sets, such as, for example, wire sets 102-4' and 104-4' of FIG. 3, as required in a given application. Bond site locations may be adjusted as needed to accommodate such arrangements. Further, the above-noted dimensions, and other dimensions, wire bond shapes, or circuit characteristics referred to herein, are presented by way of illustrative example only. Those skilled in the art will recognize that numerous alternative arrangements may be used in implementing the invention.

FIG. 4 also shows wire bond set 104-4' terminated at bond sites 408 on die Q4' at an angle that is substantially less than vertical, or 90 degrees, which was achieved with a ball-bumping technique to be described herein. This angle reduces the cross coupling of signals between this set of wires and wire bond sets 106-4' and 108-4' of the integrated circuit. As previously described, the ball-bumping technique permits the wire to terminate on the die without damaging it.

Figure 5:
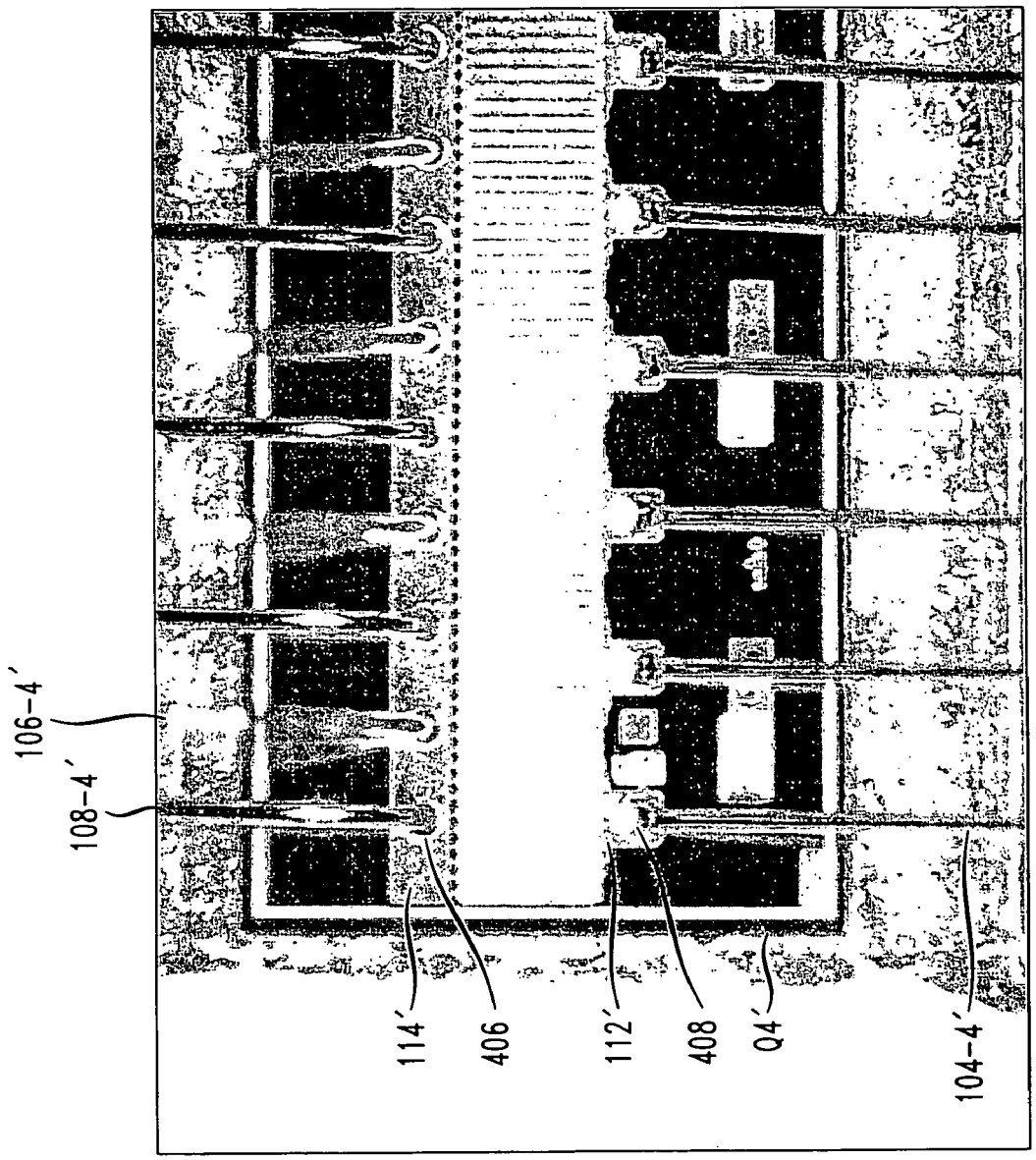
FIG. 5 is a photograph showing a magnified top view of the packaged integrated circuit of FIG. 3, having ball-bumped connections to bond pads and ball-bonded connections to a bond strip on the die, according to an embodiment of the present invention.

Referring now to FIG. 5, a top view of a portion of the packaged integrated circuit of FIG. 3 is shown. Second wire bond set 104-4' is terminated on ball bumps 408 at individual bond pads 112' of die Q4'. Third and fourth wire bond sets 106-4', 108-4' are bonded to die Q4' by ball bonds 406 at a bond rail 114'. Modern ball bonders are able to reliably form small ball diameters for ball-bonding operations and also have a smaller face and cup size for the bonding tool. Therefore, for this application, the bond pad size is minimized to reduce capacitance, which typically degrades RF performance. The mashed ball diameter for this application is approximately two times the wire diameter, allowing the ball bonds to fit on bond pads that are normally suitable for wedge bonding.

Figure 6:
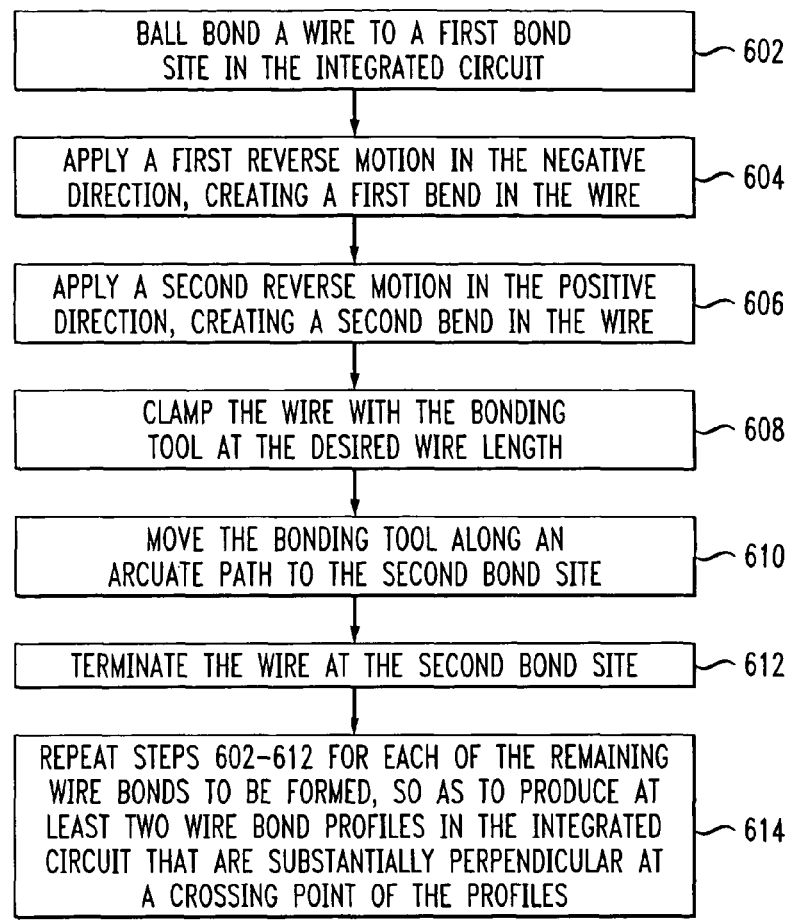
FIG. 6 is a flow diagram illustrating a ball-bonding methodology for an RF integrated circuit, according to an embodiment of the present invention.

Referring now to FIG. 6, a flow diagram illustrates a ball bonding methodology for an RF integrated circuit. This example methodology may be used to form the wire bonds shown in FIGS. 3 through 5. In step 602, a wire is ball bonded to a first bond site of the integrated circuit. In step 604, a first reverse motion is applied in the negative direction, creating a first bend in the wire, as the wire is drawn out above the first bond site. In performing the negative reverse motion, the bonding tool moves vertically above the ball bond then moves horizontally in the direction of the second bond site, creating a bend in the wire, before continuing the wire bond formation. This negative reverse motion may be applied, for a given wire bond, at a distance approximately 0.2 mm (0.008 in.) along the length of the wire, above its corresponding bond site. Such an arrangement is suitable for wire bonds in the set 104-4' and 106-4' of FIGS. 3-5. Typically, the use of a negative reverse motion in such an arrangement results in a wire bond profile having a height greater than approximately 0.6 mm (0.025 in.), and a neck angle toward the second bond site. A slight bend may be evident in the wire bond profile at the point along the length of the wire where the bonding tool applied the negative reverse motion.

Since wire above the first ball bond is naturally pulled in a direction toward the second bond site during wire bond profile formation, forming a bend in the wire close to the first ball bond allows for increased height of the wire bond profile by maintaining a straight vertical section of wire above the ball. On a low wire bond profile, as in the case of a wire bond from the die to the lead, a negative reverse motion is applied at an increased wire length to reduce the wire bond profile height. For example, for the formation of wire bonds in set 108-4' of FIGS. 3-5, the negative reverse motion may be applied, for a given wire bond, at a distance approximately 1.1 mm (0.04 in.) along the length of the wire, above the first bond site. As indicated above, other dimensions may be used.

In step 606, a second reverse motion is applied in the positive direction, creating a second bend in the wire. In performing the positive reverse motion the bonding tool moves vertically above the ball bond, then horizontally in a direction away from the second bond site, before continuing the formation of the wire bond profile. For example, in performing the positive reverse motion for high wire bond profiles, such as wire bond set 106-4', the bonding tool moves approximately 0.6 mm (0.025 in.) along the length of the wire, vertically above the bond site, and then moves in a horizontal direction opposite that of the second bond site. In the illustrative embodiment, both a negative reverse motion and a positive reverse motion are applied for each of the wire bonds in sets 104-4', 106-4' and 108-4' of the integrated circuit. The distances along the wire at which the reverse motions are applied depends on application-specific factors such as desired wire bond profile height, desired wire bond profile shape, distance between the first and second bond sites, and wire diameter, as will be appreciated by those skilled in the art.

In step 608, the bonding tool clamps the wire at a desired wire length. In step 610, the bonding tool moves the wire along an arcuate path to the second bond site. The steps result in very accurate control of the length of wire in forming the wire bond profile. In step 612, the wire is terminated at the second bond site. This wire bond may have a traditional termination for ball-bonding techniques if the first bond site is on a die and the wire is terminated, on a lead. However, if the wire is terminated on a die or capacitor of the integrated circuit, a ball-bumping technique is used as described in FIG. 7 below. In step 614, steps 602 through 612 of the methodology are repeated for one or more additional wire bonds of the integrated circuit, using wire characteristics and other parameters appropriate to those wire bonds.

The particular types of reverse motion described in conjunction with FIG. 6 are presented by way of example only, and may be varied in alternative embodiments.

Figure 7:
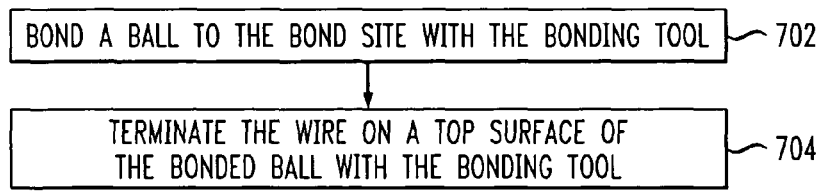
FIG. 7 is a flow diagram illustrating a ball-bumping methodology, which may be performed at step 612 of FIG. 6, according to an embodiment of the present invention.

As mentioned above, a ball-bumping technique may be utilized in terminating wires on dies and capacitors of the integrated circuit, as illustrated in the methodology of FIG. 7. In step 702, the bonding tool bonds a ball to the second bond site. In step 704, the bonding tool terminates the wire on a top surface of the bonded ball, creating a wire bond profile. If the wire bonds are terminated on leads, the ball-bumping technique is not necessary, and the wire bond may be terminated on the lead using an otherwise conventional wedge bond.

Advantageously, the methodologies of FIGS. 6 and 7 create an integrated circuit in which at least two wire bond profiles are substantially perpendicular at their crossing point.

Figure 8:
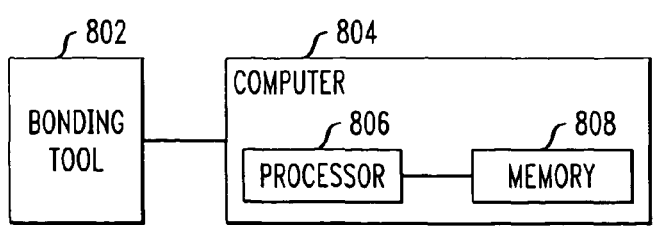
FIG. 8 is a block diagram illustrating an example bonding system suitable for implementing a wire-bonding technique, according to an embodiment of the present invention.

Referring now to FIG. 8, a block diagram illustrates an example of bonding system 800 in which a wire-bonding technique of the invention may be implemented. As illustrated, the system 800 comprises a bonding tool 802 coupled to a computer 804 which may comprise a processor 806 and a memory 808. One or more of the steps shown in FIGS. 6 and 7 may be performed at least in part utilizing software executed by processor 806 and stored in memory 808.

Accordingly, as described herein, the present invention in the illustrative embodiment provides a wire-bonding technique that creates ball bonded wire bond profiles for optimal RF performance.

Additional embodiments of the present invention may incorporate various numbers and combinations of transistor dies, tuning capacitors, leads, or other circuit elements, arranged in various configurations within a given integrated circuit. The positioning and number of transistor dies, tuning capacitors and other elements will of course result in various numbers and configurations of wire bonds and associated bond sites. The techniques of the present invention may also be used in non-RF integrated circuits. Further, additional embodiments may incorporate various wire bond shapes, wire bond heights, wire diameters and other wire characteristics.

Therefore, although illustrative embodiments of the present invention have been described herein with reference to the accompanying drawings, it is to be understood that the invention is not limited to those precise embodiments, and that various other changes and modification may be made by one skilled in the art without departing from the scope or spirit of the invention.

What is claimed is:

1. Apparatus for performing a wire-bonding operation in an integrated circuit, the apparatus comprising:
    a bonding tool;
    a memory; and
    at least one processor, coupled to the memory;
    wherein the processor is programmed to cause the bonding tool to perform, for each of a plurality of wires in the integrated circuit, an operation of ball bonding the wire to a corresponding first bond site in the integrated circuit; an operation of forming at least one bend in the wire; and an operation of terminating the wire at a corresponding second bond site, thereby creating a plurality of bonded wires having respective profiles and being associated with respective pairs of first and second bond sites;
    wherein the profiles of a first set of the plurality of bonded wires in the integrated circuit are substantially perpendicular to respective profiles of a second set of the plurality of bonded wires in the integrated circuit at respective crossing points thereof, with the profiles of the first and second sets of bonded wires residing in respective planes that are substantially parallel to one another, and either the first bond sites or the second bond sites associated with said first and second sets of bonded wires all being located on a given die of the integrated circuit;
    wherein the operation of forming at least one bend in the wire comprises an operation of applying at least one reverse motion with the bonding tool;
    wherein a first reverse motion forming a bend adjacent to the first bond site is applied at a greater distance from the first bond site along a length of the wire for a first wire from the first set of the plurality of bonded wires than for a second wire from the second set of the plurality of bonded wires; and wherein the first set of the plurality of bonded wires has a lower bond profile height relative to the second set of the plurality of bonded wires.

2. The apparatus of claim 1, wherein the operation of applying at least one reverse motion comprises applying a negative reverse motion and a positive reverse motion.

3. The apparatus of claim 2, wherein the negative reverse motion is applied at approximately 0.2 mm from the first bond site along a length of the second wire.

4. The apparatus of claim 2, wherein the positive reverse motion is applied at approximately 0.6 mm from the first bond site along a length of the second wire.

5. The apparatus of claim 4, wherein the profile of the second wire has a height of approximately 0.6 mm.

6. The apparatus of claim 2, wherein the negative reverse motion is applied at approximately 1.1 mm from the first bond site along a length of the first wire.

7. The apparatus of claim 1, wherein the processor is programmed to cause the bonding tool to perform for each of a plurality of wires in the integrated circuit:
    an operation of clamping the wire at a desired length after the operation of forming at least one bend in the wire; and
    an operation of moving along an arcuate path to the second bond site before the operation of terminating the wire at the second bond site.

8. The apparatus of claim 1, wherein the operation of terminating the wire at the second bond site comprises:
    an operation of bonding a ball to the second bond site; and
    an operation of terminating the wire on a top surface of the bonded ball at the second bond site.

9. The apparatus of claim 8, wherein the wire is terminated at a die or a capacitor of the integrated circuit.

10. The apparatus of claim 1, wherein the at least one bend prevents the wire bond profile from skewing in a direction away from the second bond site.

11. The apparatus of claim 1, wherein the integrated circuit comprises a radio-frequency integrated circuit.

12. The apparatus of claim 1, wherein the first bond site of each of the plurality of wires is disposed on a capacitor and the second bond site of each of the plurality of wires is disposed on a die.

13. The apparatus of claim 12, wherein the operation of terminating the wire comprises terminating the wire at an angle substantially less than 90 degrees, thereby decreasing cross coupling of the wire with other wires of the integrated circuit.

14. The apparatus of claim 1, wherein the first bond site of each of the plurality of wires is disposed on a die and the second bond site of each of the plurality of wires is disposed on a capacitor.

15. The apparatus of claim 1, wherein the first bond site of each of the plurality of wires is disposed on a die and the second bond site of each of the plurality of wires is disposed on a lead of an integrated circuit package.

16. The apparatus of claim 15, wherein the operation of terminating the wire at a second bond site comprises terminating the wire with a wedge bond.

17. An article of manufacture for performing a wire-bonding operation in an integrated circuit, utilizing a bonding tool, comprising a machine readable medium containing one or more programs which when executed cause the bonding tool to perform, for each of a plurality of wires in the integrated circuit, the operations of:

ball bonding the wire to a corresponding first bond site in the integrated circuit;

forming at least one bend in the wire; and terminating the wire at a corresponding second bond site, thereby creating a plurality of bonded wires having respective profiles and being associated with respective pairs of first and second bond sites;

wherein the profiles of a first set of the plurality of bonded wires in the integrated circuit are substantially perpendicular to respective profiles of a second set of the plurality of bonded wires in the integrated circuit at respective crossing points thereof, with the profiles of the first and second sets of bonded wires residing in respective planes that are substantially parallel to one another, and either the first bond sites or the second bond sites associated with said first and second sets of bonded wires all being located on a given die of the integrated circuit;

wherein the operation of forming at least one bend in the wire comprises an operation of applying at least one reverse motion with the bonding tool;

wherein a first reverse motion forming a bend adjacent to the first bond site is applied at a greater distance from the first bond site along a length of the wire for a first wire from the first set of the plurality of bonded wires than for a second wire from the second set of the plurality of bonded wires; and wherein the first set of the plurality of bonded wires has a lower bond profile height relative to the second set of the plurality of bonded wires.

18. The apparatus of claim 2, wherein the operation of applying at least one reverse motion comprises applying the negative reverse motion prior to the positive reverse motion.

19. The apparatus of claim 2, wherein the negative reverse motion comprises moving vertically above the ball bond and in a first horizontal direction toward the second bond site, and wherein the positive reverse motion comprises moving vertically above the ball bond and in a second horizontal direction away from the second bond site.

20. The apparatus of claim 1, wherein either the first bond sites or the second bond sites associated with said first and second sets of bonded wires are arranged in a substantially straight line along one side of an upper surface of the die.

21. The article of claim 17, wherein either the first bond sites or the second bond sites associated with said first and second sets of bonded wires are arranged in a substantially straight line along one side of an upper surface of the die.

\* \* \* \* \*